United States Patent
Ban et al.

(10) Patent No.: US 11,984,824 B2
(45) Date of Patent: May 14, 2024

(54) SENSING SYSTEM

(71) Applicant: SHIMCO NORTH AMERICA INC., Cambridge (CA)

(72) Inventors: Dayan Ban, Waterloo (CA); Peter Michael Voss, Cambridge (CA)

(73) Assignee: SHIMCO NORTH AMERICA INC., Cambridge (CA)

( * ) Notice: Subject to any disclaimer, the term of this patent is extended or adjusted under 35 U.S.C. 154(b) by 668 days.

(21) Appl. No.: 16/762,816

(22) PCT Filed: Nov. 8, 2018

(86) PCT No.: PCT/CA2018/051412
§ 371 (c)(1),
(2) Date: May 8, 2020

(87) PCT Pub. No.: WO2019/090426
PCT Pub. Date: May 16, 2019

(65) Prior Publication Data
US 2021/0175822 A1    Jun. 10, 2021

(30) Foreign Application Priority Data
Nov. 10, 2017   (CA) ................................ CA 2985238

(51) Int. Cl.
*G01B 7/00* (2006.01)
*B64D 43/00* (2006.01)
(Continued)

(52) U.S. Cl.
CPC ............... *H02N 2/18* (2013.01); *B64D 43/00* (2013.01); *G01B 7/18* (2013.01); *H10N 30/1061* (2023.02); *B82Y 15/00* (2013.01)

(58) Field of Classification Search
CPC . G01B 7/18; B64D 43/00; H02N 2/18; B82Y 15/00
See application file for complete search history.

(56) References Cited

U.S. PATENT DOCUMENTS 7,758,979 B2 *  7/2010  Akiyama .............. H01L 41/187
                                                         428/704
9,368,710 B2    6/2016  Wang et al.
(Continued)

FOREIGN PATENT DOCUMENTS

CA        2967004 A1    11/2018
CN      101325240 A     12/2008
(Continued)

OTHER PUBLICATIONS

G. Liu, "Semiconductor Nanowire Based Piezoelectric Energy Harvesters: Modeling, Fabrication, and Characterization," Ph.D. thesis, 2015, University of Waterloo.
(Continued)

*Primary Examiner* — Jamel E Williams
(74) *Attorney, Agent, or Firm* — NORTON ROSE FULBRIGHT CANADA LLP

(57) ABSTRACT

The present invention relates to a sensing system that, in a preferred embodiment, can be readily integrated into load-lifting structures (such as wings and landing gears) to provide real-time DPHM and obviate/mitigate catastrophic problems. Broadly, the present sensing system combines at least one shim portion with at least one nanogenerator such as a TENG or a PENG. A major advantage of the present sensing system is that it combines in a single structure the following functions: (a) gap management in the component in which the sensing system is installed, (b) collection/storage of measured data for the component in which the sensing system is installed, (c) harvesting/storing energy from operation environment of the component in which the sensing system is installed (e.g., DPHM data when the present sensing system is used for assessment of an aircraft's structural conditions), and (d) wireless transmission of mea-
(Continued)

sured data for the component in which the sensing system is installed to a user interface.

22 Claims, 12 Drawing Sheets

(51) Int. Cl.
*G01B 7/16* (2006.01)
*H02N 2/18* (2006.01)
*H10N 30/00* (2023.01)
*B82Y 15/00* (2011.01)

(56) References Cited

U.S. PATENT DOCUMENTS

| | | | |
|---|---|---|---|
| 9,719,900 | B1 | 8/2017 | Wang |
| 2014/0007687 | A1 | 1/2014 | Wang et al. |
| 2014/0007867 | A1 | 1/2014 | Bruin et al. |
| 2017/0257040 | A1* | 9/2017 | Nguyen-Dinh ..... H01L 41/1138 |
| 2018/0366611 | A1 | 12/2018 | Ban et al. |

FOREIGN PATENT DOCUMENTS

| | | |
|---|---|---|
| CN | 104113268 A | 10/2014 |
| CN | 204156752 | 2/2015 |
| CN | 204156752 U | 2/2015 |
| JP | 2010502893 | 1/2010 |
| JP | 2013039444 | 2/2013 |
| JP | 7203857 B2 | 1/2023 |
| WO | WO2017156175 | 9/2017 |
| WO | 2019090426 A1 | 5/2019 |

OTHER PUBLICATIONS

M. Q. Le, J.-F. Capsal, M. Lallart, Y. Hebrard, A. Van Der Ham, N. Reffe, L. Geynet, and P.-J. Cottinet, "Review on energy harvesting for structural health monitoring in aeronautical applications," Prog. Aerosp. Sci., 2015, 79, 147-157.
Y. Hu and Z. L. Wang, "Recent progress in piezoelectric nanogenerators as a sustainable power source in self-powered systems and active sensors," Nano Energy, 2015, 14, 3-14.
R. Hinchet, W. Seung, and S. W. Kim, "Recent Progress on Flexible Triboelectric Nanogenerators for SelfPowered Electronics," ChemSusChem, Aug. 2015, 2327-2344.
F. R. Fan, W. Tang, and Z. L. Wang, "Flexible Nanogenerators for Energy Harvesting and Self-Powered Electronics," Adv. Mater., 2016.
Z. L. Wang, J. Chen, and L. Lin, "Progress in triboelectric nanogenerators as a new energy technology and self-powered sensors," Energy Environ. Sci., Aug. 2015, 2250-2282.
J. Briscoe and S. Dunn, "Piezoelectric nanogenerators—a review of nanostructured piezoelectric energy harvesters," Nano Energy, 2015, 14, 15-29.
S. Wang, L. Lin, and Z. L. Wang, "Triboelectric nanogenerators as self-powered active sensors," Nano Energy, Nov. 2015, 436-462.
M. Han, X.-S. Zhang, B. Meng, W. Liu, W. Tang, X. Sun, W. Wang, and H. Zhang, "r-Shaped hybrid nanogenerator with enhanced piezoelectricity," ACS Nano, Jul. 2013, 8554-8560.
X. Li, Z.-H. Lin, G. Cheng, X. Wen, Y. Liu, S. Niu, and Z. L. Wang, "3D Fiber-Based Hybrid Nanogenerator for Energy Harvesting and as a Self-Powered Pressure Sensor," ACS Nano, Aug. 2014, 10674-10681.
K. Y. Lee, M. K. Gupta, and S.-W. Kim, "Transparent flexible stretchable piezoelectric and triboelectric nanogenerators for powering portable electronics," Nano Energy, 2015, 14, 139-160.
S.-B. Jeon, D. Kim, G.-W. Yoon, J.-B. Yoon, and Y.-K. Choi, "Self-cleaning hybrid energy harvester to generate power from raindrop and sunlight," Nano Energy, Dec. 2015, 636-645.
X. Wang, S. Wang, Y. Yang, and Z. L. Wang, "Hybridized Electromagnetic-Triboelectric Nanogenerator for Scavenging Air-Flow Energy to Sustainably Power Temperature Sensors," ACS Nano, Sep. 2015, 4553-4562.
T. Quan, X. Wang, Z. L. Wang, and Y. Yang, "Hybridized Electromagnetic—Triboelectric Nanogenerator for a Self-Powered Electronic Watch," ACS Nano, Sep. 2015, 12301-12310.
Y. Zi, L. Lin, J. Wang, S. Wang, J. Chen, X. Fan, P. K. Yang, F. Yi, and Z. L. Wang, "Triboelectric—Pyroelectric-Piezoelectric Hybrid Cell for High-Efficiency Energy-Harvesting and Self-Powered Sensing," Adv. Mater., 2015, 27, 2340-2347.
Y. Yang and Z. L. Wang, "Hybrid energy cells for simultaneously harvesting multi-types of energies," Nano Energy, 2015, 14, 245-256.
S. Wang, Z. L. Wang, and Y. Yang, "A One-Structure-Based Hybridized Nanogenerator for Scavenging Mechanical and Thermal Energies by Triboelectric-Piezoelectric-Pyroelectric Effects," Advanced materials (Deerfield Beach, Fla.), 2016.
W.-S. Jung, M.-G. Kang, H. G. Moon, S.-H. Baek, S.-J. Yoon, Z.-L. Wang, S.-W. Kim, and C.-Y. Kang, "High output biezo/triboelectric hybrid generator," Sci. Rep., May 2015.
S. Niu, Y. Liu, S. Wang, L. Lin, Y. S. Zhou, Y. Hu, and Z. L. Wang, "Theoretical Investigation and Structural Optimization of Single-Electrode Triboelectric Nanogenerators," Adv. Funct. Mater., 2014, 24, 3332-3340.
H. Jang, Y. J. Park, X. Chen, T. Das, M. S. Kim, and J. H. Ahn, "Graphene-Based Flexible and Stretchable Electronics," Adv. Mater., 2016.
C. Hu, L. Song, Z. Zhang, N. Chen, Z. Feng, and L. Qu, "Tailored graphene systems for unconventional applications in energy conversion and storage devices," Energy Environ. Sci., Aug. 2015, 31-54.
B. N. Chandrashekar, B. Deng, A. S. Smitha, Y. Chen, C. Tan, H. Zhang, H. Peng, and Z. Liu, "Roll-to-Roll Green Transfer of CVD Graphene onto Plastic for a Transparent and Flexible Triboelectric Nanogenerator," Adv. Mater., 2015, 27, 5210-5216.
S. Kim, M. K. Gupta, K. Y. Lee, A. Sohn, T. Y. Kim, K. S. Shin, D. Kim, S. K. Kim, K. H. Lee, and H. J. Shin, "Transparent flexible graphene triboelectric nanogenerators," Adv. Mater., 2014, 26, 3918-3925.
L. E. Greene, M. Law, J. Goldberger, F. Kim, J. C. Johnson, Y. Zhang, R. J. Saykally, and P. Yang, "Low-temperature wafer-scale production of ZnO nanowire arrays," Angew. Chem. Int. Ed., 2003, 42, 3031-3034.
D.-M. Shin, E. L. Tsege, S. H. Kang, W. Seung, S.-W. Kim, H. K. Kim, S. W. Hong, and Y.-H. Hwang, "Freestanding ZnO nanorod/graphene/ZnO nanorod epitaxial double heterostructure for improved piezoelectric nanogenerators," Nano Energy, Dec. 2015, 268-277.
G. Liu, S. Zhao, R. D. Henderson, Z. Leonenko, E. Abdel-Rahman, Z. Mi, and D. Ban, "Nanogenerators based on vertically aligned InN nanowires," Nanoscale, Aug. 2016, 2097-2106.
G. Liu, E. Abdel-Rahman, D. Ban, "Performance optimization of p-n homojunction nanowire-based piezoelectric nanogenerators through control of doping concentration." J. Appl. Phys., 2915, 118, 094307.
R. S. Dhar, L. Li, H. Ye, S, G. Razavipour, X. Wang, R. Q. Yang, D. Ban, "Nanoscopically resolved dynamic charge carrier distribution in operating interband cascade lasers," Laser & Photonics Review, Aug. 2015, 224.
R. S. Dhar, S. G. Razavipour, E. Dupont, C. Xu, S. Laframboise, Z. Wasilewski, Q. Hu, D. Ban, "Direct Nanoscale Imaging of Evolving Electric Field Domains in Quantum Structures," Scientific Reports, Apr. 2014, 7183.
S. Fathololoumi, E. Dupont, C. W. I. Chan, etc., "Terahertz quantum cascade lasers operating up to ~200K with optimized oscillator strength and improved injection tunneling," Optics Express, 2012, 20, 3866.
Jun Chen, Dayan Ban, Michael G. Helander, Zhenghong Lu and P. Poole, "Near-infrared inorganic/organic optical upconverter with an external efficiency of > 100%", Advanced Materials, 2010, 22, 4900.
Jun Chen, Jianchen Tao, Dayan Ban, M. G. Helander, Z. Wang, J. Qiu, Z. H. Lu, "Organic/Inorganic Hybrid Pixelless Imaging Device," Advanced Materials, 2012, 24, 3138.
Cheng-Ying Chen, Jun-Han Huang, Jinhui Song, Yusheng Zhou, Long Lin, Po-Chien Huang, Yan Zhang, Chuan-Pu Liu, Jr-Hau He,

(56) References Cited

OTHER PUBLICATIONS and Zhong Lin Wang, "Anisotropic Outputs of a Nanogenerator from Oblique-Aligned ZnO Nanowire Arrays" ACS Nano, May 2011, 6707-6713.

Nai-Jen Ku, Jun-Han Huang, Chao-Hung Wang, Hsin-Chiao Fang, and Chuan-Pu Liu, "Crystal Face-Dependent Nanopiezotronics of an Obliquely Aligned InN Nanorod Array" Nano Letters, Dec. 2012, 562-568.

Ruey-Chi Wang, Hsin-Ying Lin, Chao-Hung Wang, and Chuan-Pu Liu, "Fabrication of a large-area AI-doped ZnO nanowire array photosensor with enhanced photoresponse by straining" Advanced Functional Materials, 2012, 22, 3875-3881.

Nai-Jen Ku, Chao-Hung Wang, Jun-Han Huang, Hsin-Chiao Fang, Po-Chien Huang and Chuan-Pu Liu, "Energy Harvesting from the Obliquely Aligned InN Nanowire Array with a Surface Electron-Accumulation Layer" Advanced Materials, 2013, 25, 861-866.

Chia-Hao Tu, Waileong Chen, Hsin-Chiao Fang, Yonhua Tzeng, Chuan-Pu Liu, "Heteroepitaxial nucleation and growth of graphene nanowalls on silicon" Carbon, 2013, 54, 234-240.

Chao-Hung Wang, Wei-Shun Liao, Zong-Hong Lin, Nai-Jen Ku, Yi-Chang Li, Yen-Chih Chen, Zhong-Lin Wang and Chuan-Pu Liu, "Optimization of the Output Efficiency of GaN Nanowire Piezoelectric Nanogenerators by Tuning the Free Carrier Concentration" Advanced Energy Materials, Apr. 2014, 1400392.

Chao-Hung Wang, Wei-Shun Liao, Nai-Jen Ku, Yi-Chang Li, Yen-Chih Chen, Li-Wei Tu and Chuan-Pu Liu, "Effects of Free Carriers on Piezoelectric Nanogenerators and Piezotronic Devices Made of GaN Nanowire Arrays" Small, Oct. 2014, 4718-4725.

Yen-Yu Chen, Chao-Hung Wang, Giin-Shan Chen, Yi-Chang Li and Chuan-Pu Liu, "Self-powered n—MgxZn1—xO/p—Si photodetector improved by alloying-enhanced piezopotential through piezo-phototronic effect" Nano Energy, Nov. 2015, 533-539.

Chao-Hung Wang, Kun-Yu Lai, Yi-Chang Li, Yen-Chih Chen, and Chuan-Pu Liu, "Ultrasensitive Thin-Film-Based AlxGa1—xN Piezotronic Strain Sensors via Alloying-Enhanced Piezoelectric Potential" Advanced Materials, 2015, 27, 6289-6295.

Dayan Ban, Guocheng Liu, "Cascade-type hybrid energy cells for driving wireless sensors", Nano Energy 26 (2016) 641-647, copending Canadian patent application 2,967,004 and U.S. Appl. No. 62/602,895, both filed on May 11, 2017.

International Search Report and Written Opinion mailed Mar. 1, 2019, from PCT/CA2018/051412, 8 sheets.

International Preliminary Report on Patentability issued May 12, 2020, from PCT/CA2018/051412, 6 sheets.

The extended European search report dated Jun. 9, 2021, from European Application No. 18875056.6, 8 sheets.

Byeong-Ung Hwang et al: "Transparent Stretchable Self-Powered Patchable Sensor Platform with Ultrasensitive Recognition of Human Activities", ACS NANO, vol. 9, No. 9, Sep. 22, 2015 (Sep. 22, 2015), pp. 8801-8810, XP055658914, US ISSN: 1936-0851, DOI: 10.1021/acsnano.5b01835 *abstract; figure 1*, 10 sheets.

Hemtej Gullapalli et al: "Flexible Piezoelectric Zn0-Paper Nanocomposite Strain Sensor", Small, vol. 6, No. 15, Aug. 2, 2010 (Aug. 2, 2010), pp. 1641-1646, XP055066334, ISSN: 1613-6810, DOI: 10.1002/smll.201000254 *abstract; figures 1, 3*, 6 sheets.

First Office Action mailed May 24, 2022, from Japanese Patent Application No. 2020-544078, 4 sheets.

Second Office Action dated Sep. 5, 2022, from Chinese Patent Application No. 201880072025.9, 5 sheets.

First Office Action dated Oct. 15, 2021, with Search Report, from Chinese Patent Application No. 201880072025.9, 12 sheets.

A third office action issued in the corresponding Chinese Patent Application No. 201880072025.9, dated May 4, 2023.

An office action received in the corresponding Japanese Patent Application No. 2022-210056, mailing date Apr. 4, 2023, issued by the Japanese Intellectual Property Office.

An office action issued in the corresponding Brazilian Patent Application No. 112020009189-8, dated May 23, 2023.

"Transparent Strechable Self-Powered Patchable Sensor Platform with Ultasensitive Recognition of Human Activities", ACS NANO, US, Byeong-Ung Hwang et al.

"Flexible Piezoelectric ZnO-Paper Nanocomposite Strain Sensor", Small, Hemtej Gullapalli et al.

An office action issued in the corresponding Japanese Patent Application No. 2022-210056, mailing date Sep. 19, 2023.

\* cited by examiner

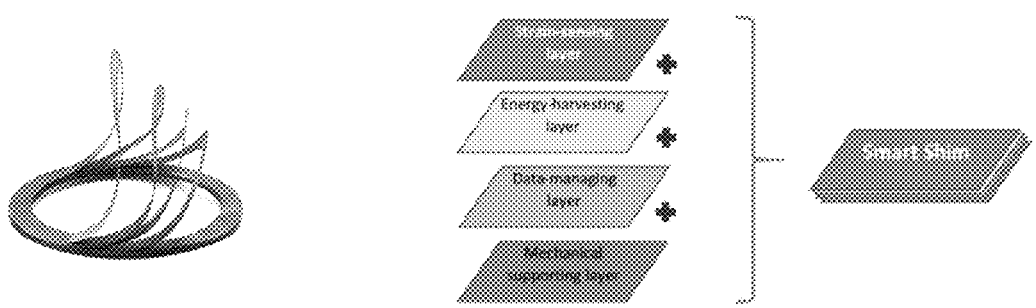
Figure 1. Left: a conventional laminated shim, which can be used only for mechanically filling gaps. Each peelable layer is typically identical. Right: a schematic diagram of the proposed smart shim, which integrated different layers, for multiple functions.

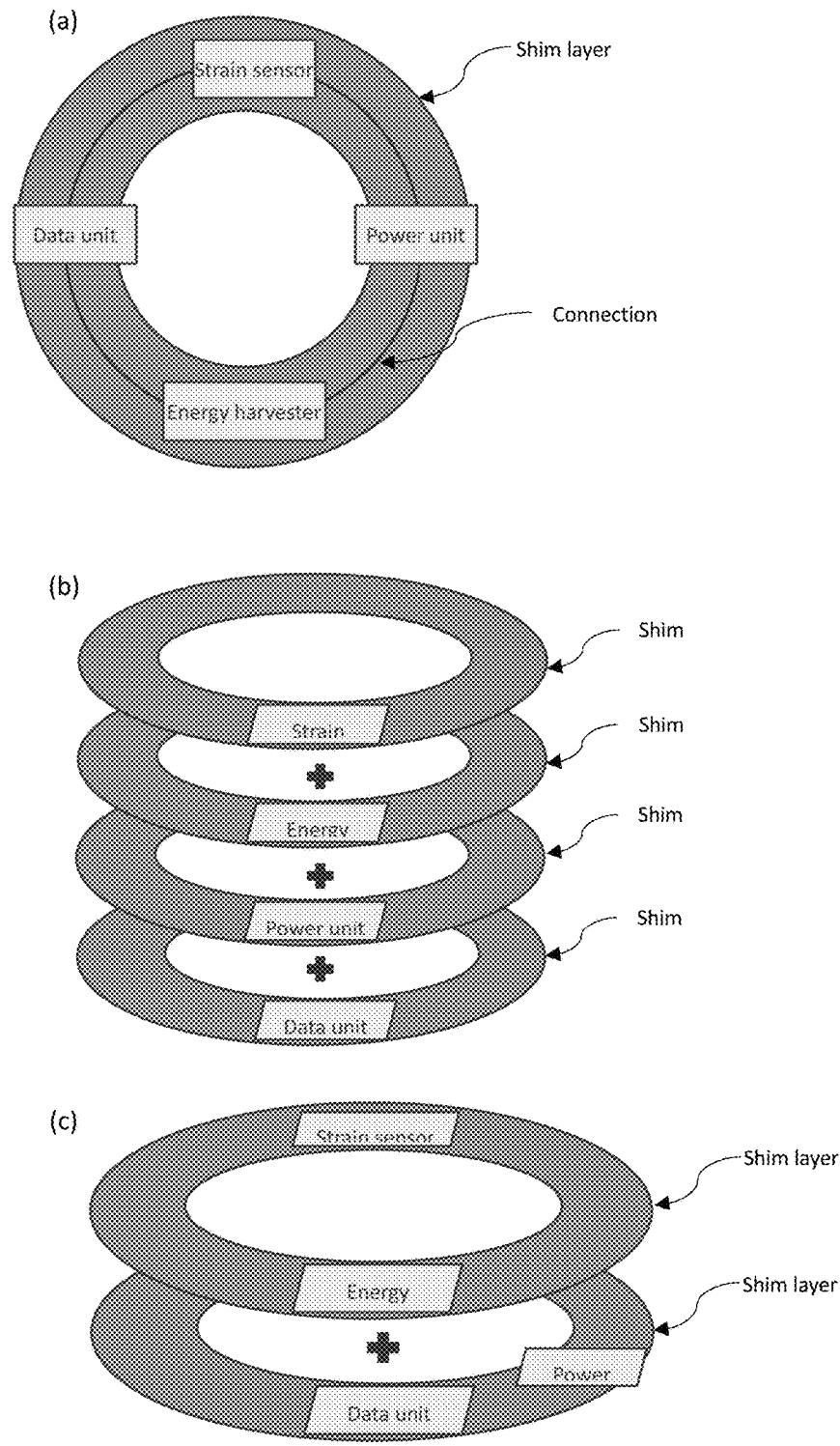
Figure 2. Different layouts of the smart shim. (a) parallel layout; (b) vertical layout; (c) hybrid layout.

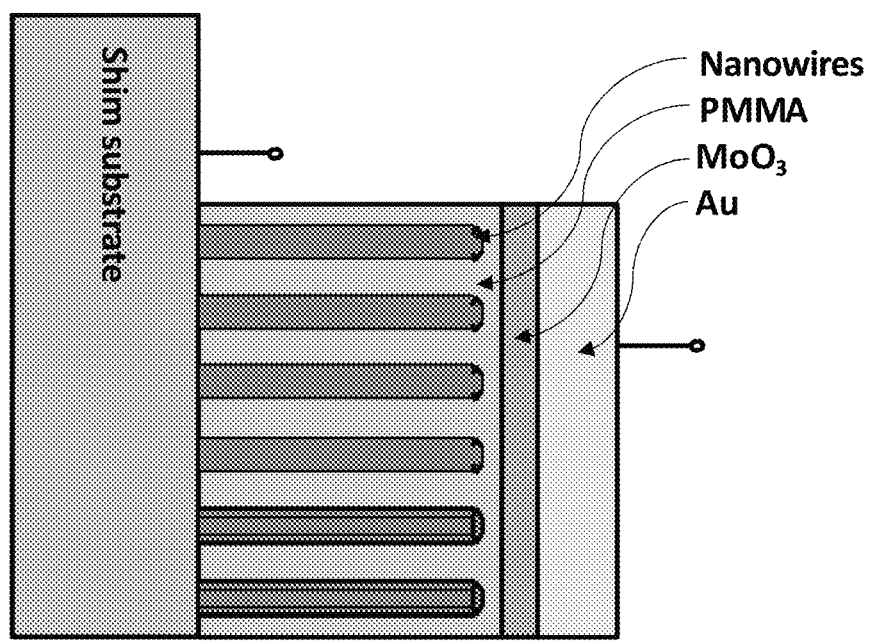
Figure. 3, the vertical layout of an example strain sensor.

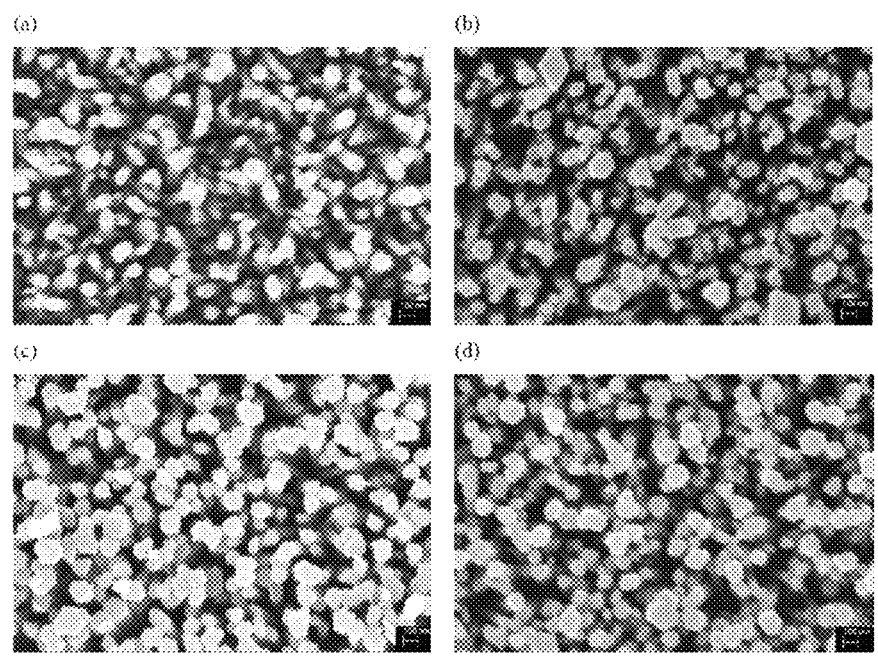
Figure. 4 Top-view SEM images of ZnO homojunctions NWs on AZO with (a) 0% Li-doping; (b) 100% Li-doping; (c) 200% Li-doping; (d) 300% Li-doping.

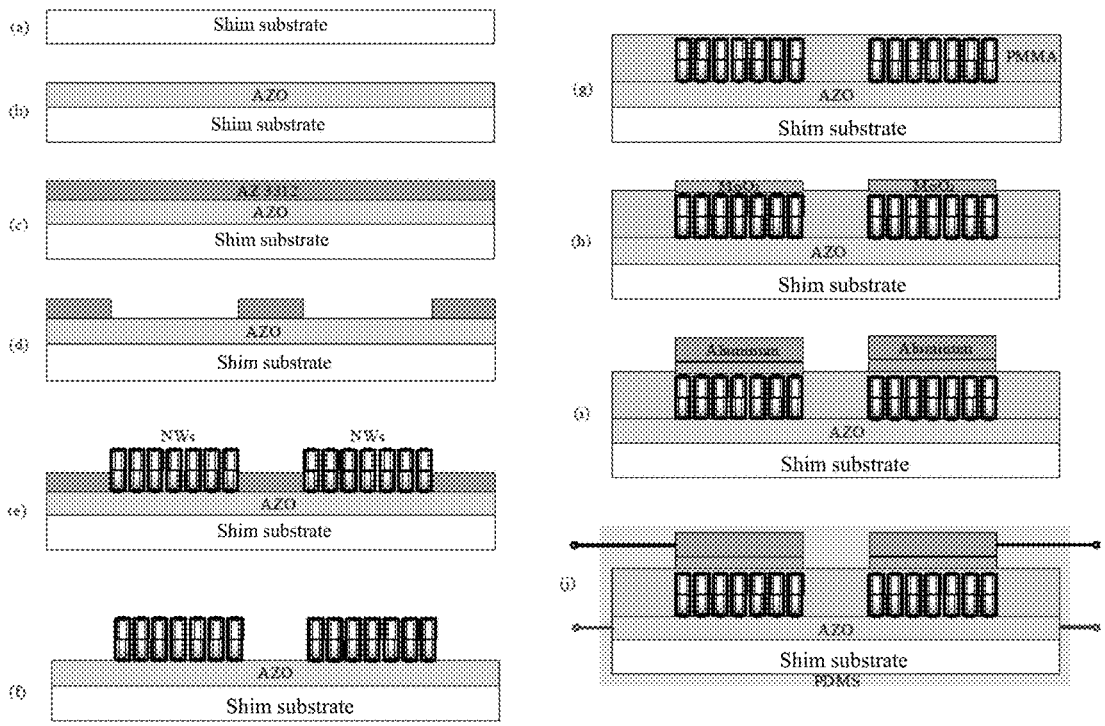

Figure 5. Schematic representation of the NG fabrication process. (a) Shim substrate. (b) Deposition of an AZO seed layer by RF sputtering. (c) Photoresist spin-coating. (d) Windows opening by photolithography. (e) Selection growth of ZnO p-n homojunction NWs. (f) Stripping off residual photoresist by acetone. (g) Spin-coating a PMMA layer to cover the structure. (h) Deposition of a $MoO_3$ layer. (i) Deposition of a metal layer as the top electrode. (j) Packing by PDMS.

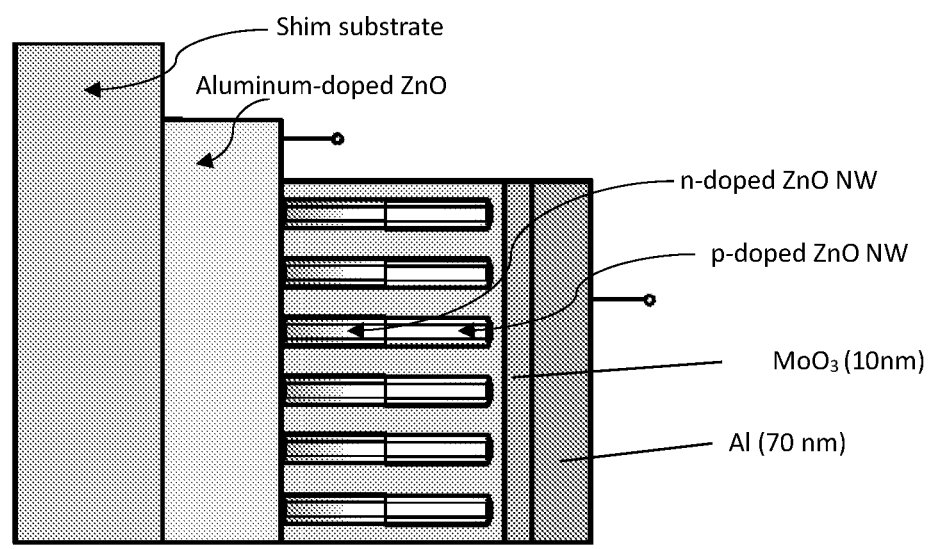
Figure 6. A schematic diagram of a fabricated nanogenerator (NG) made of the p-n homojunction ZnO NWs.

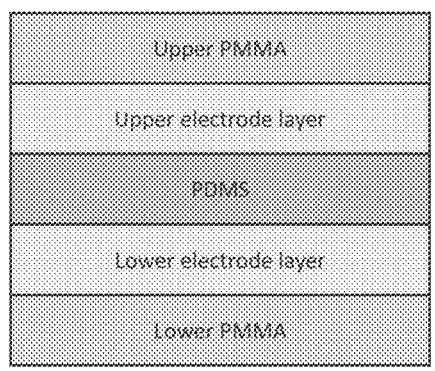
Figure 7. Layer structure of an example triboelectric energy harvester.

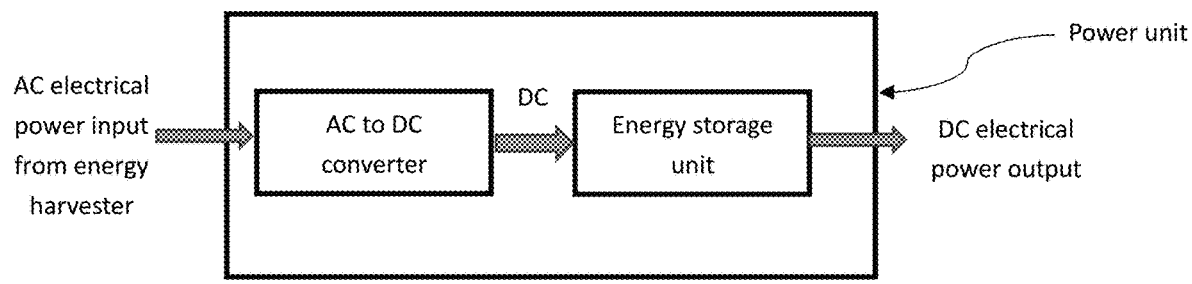
Figure 8. Layout of the power unit.

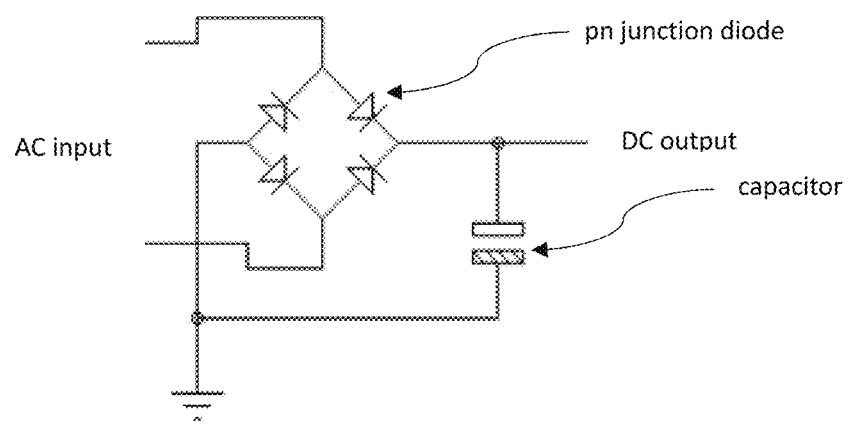
Figure 9. A typical AC to DC converter circuit.

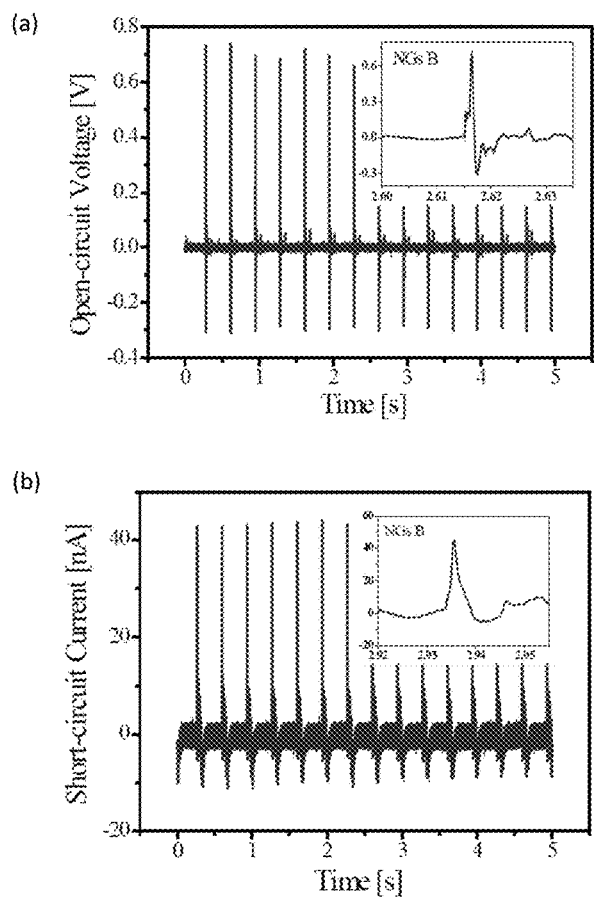
Figure 10. Measured open-circuit voltage (a) and short-circuit current (b) of a ZnO NW based piezoelectric energy harvester fabricated on a flexible substrate.

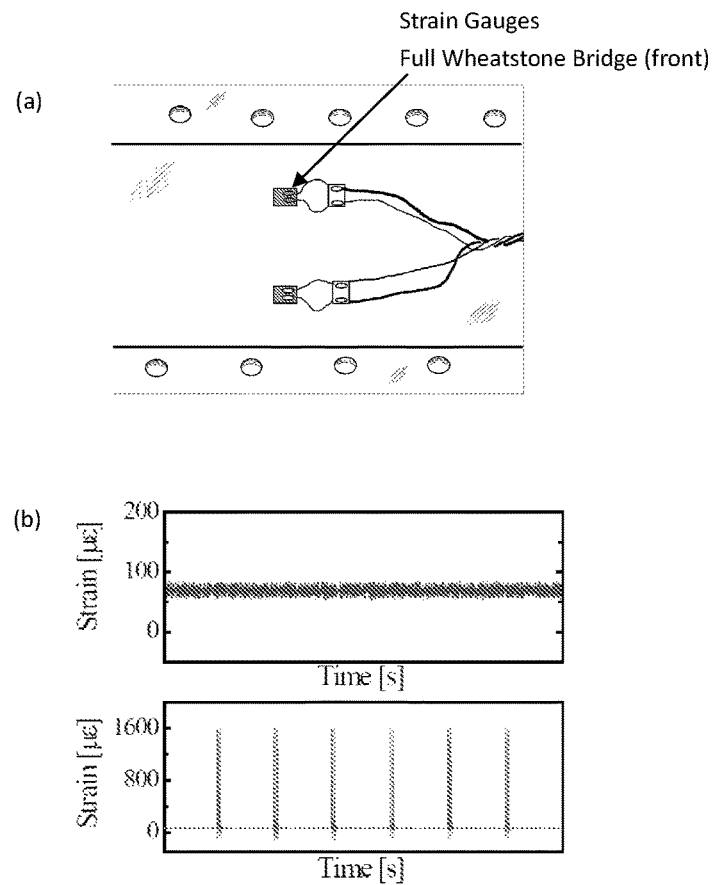

Figure 11. shows (a) two commercial strain gauges (the front-side of a Wheatstone bridge) incorporated into a commercial wireless sensor node. (b) the measured strain signals (top) without mechanical vibration and (bottom) with vibration, which were received from the wireless strain gauge sensor powered by an energy harvesting system that consists of a piezoelectric device, a full-wave bridge rectifier and a capacitor.

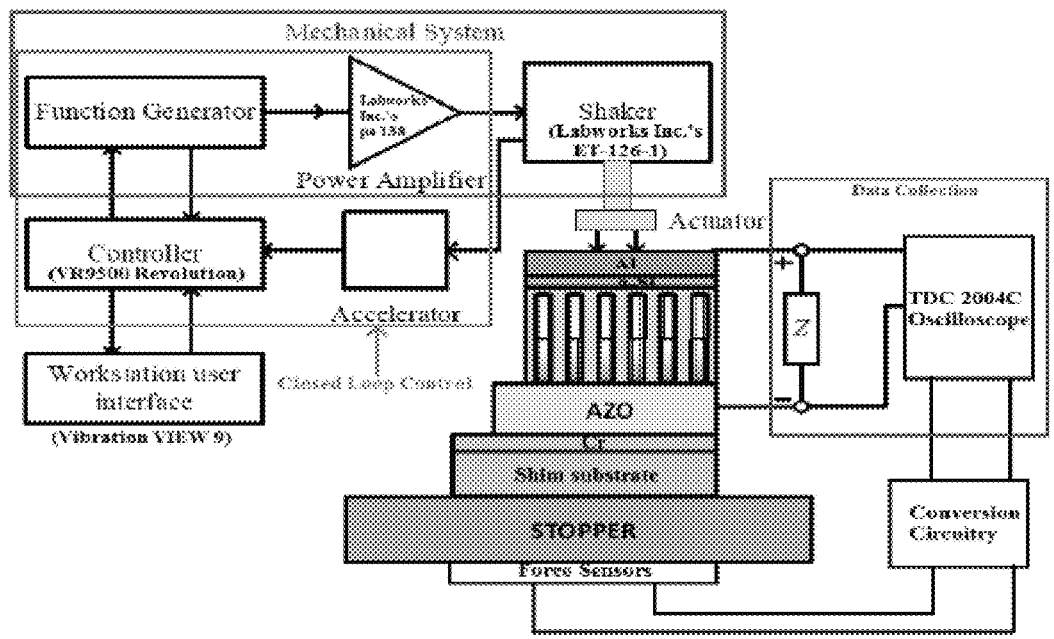
Figure 12. Schematic of a setup for the characterization of fabricated PENGs. The system includes a closed loop controller (VR9500 Revolution) and a linear shaker (Labworks Inc., ET-126-1). The shaker provides mechanical strain with a particular frequency, acceleration, and amount of force.

SENSING SYSTEM

CROSS-REFERENCE TO RELATED APPLICATION

This application is a national stage application under 35 U.S.C. § 371 based on PCT Application No. PCT/CA2018/051412, with an international filing date of Nov. 8, 2018, which claims the benefit under 35 U.S.C. § 119(e) of Canadian patent application 2,985,238, filed Nov. 10, 2017, the contents of all which are hereby incorporated by reference.

BACKGROUND OF THE INVENTION

Field of the Invention

In one of its aspects, the present invention relates to a sensing system, more particularly a sensing system comprising at least one piezoelectric sensing device coupled to at least one shim device. The sensing system may be used in, for example, aerospace applications such as aircraft, space vehicles and the like.

Description of the Prior Art

Air travel is widely used throughout the globe as a fast and efficient form of transport of passengers and cargo, with its popularity expected to increase with population growth and migration. Airbus anticipates that air traffic will continue to grow at just under 5% annually. The structural integrity of the aircraft is of highest importance, and maintaining safe operating conditions becomes a challenge as the demand for air travel increases.

As noted by Covington Aircraft, a major MRO (Maintenance, Repair and Overhaul) organization in Oklahoma, United States, "Airplane On Ground" or AOG can significantly reduce operating margins. AOG is a term used by aircraft MRO crews when a mechanical problem in an aircraft makes the plane unsafe for flying. The plane is then grounded, and in some cases, any other planes of the same make and model that the company owns could be grounded as well. It has been noted, in early 2011, one major airline cancelled approximately 300 flights after a crack appeared in the fuselage of a Boeing 737 while in flight. As a result, the airline placed 79 planes into AOG status, which cost the airline as much as $4 million in lost revenue. It is therefore highly desired by many MRO organizations and airlines that real-time aircraft Diagnostic and Prognostic Health Monitoring (DPHM) be developed and deployed so that maintenance, repair and overhaul can be planned and scheduled in advance to reduce out of service time as well as the turn-around time for regular maintenance.

Shim. Aerospace and Defence require high degrees of precision in their manufacture and assemblies. Although quality measures range between 0.0001-0.0004 inches when final integration and major subsystem assembly is performed, gaps exist in the structures and components that the industries produce—e.g., landing gears, engines, air frames and other subsystems. The gap management is conventionally accomplished by employing shim components, such as washers or thin strips of materials used to align parts, make them fit and/or reduce wear. In order to meet different needs, particularly needs for different thickness, peelable shim parts have been developed, which consist of many thin layers that are integrated by glue and can be peeled off layer by layer.

Aircraft diagnostic and prognostic health monitoring (DPHM). Aircraft diagnostic and prognostic health monitoring (DPHM) is the assessment of an aircraft's structural condition using advanced sensor technologies. Aircraft DPHM has two critical aspects: load monitoring and damage assessment. Load monitoring is performed by the combination of two methods, namely, using a limited number of wired strain sensors mounted at critical points for direct measurement, and monitoring flying parameters (such as flight time, acceleration, air pressure/density, etc.) for the estimation of loads in other locations. Damage assessment covers the detection/evaluation/monitoring of damage induced by accidents such as those arising from bird strikes, foreign objects, and maintenance, and damage caused by the environment, such as corrosion of metallic structures, delamination of composite structures and degradation of nonmetallic structures due to thermal and fluid exposure.

Energy harvesting. Currently, wired sensor networks are still the industry standard for DPHM, which are widely deployed in most Boing/AirBus/Bombardier/Embraer aircraft. The wired system offers advantages such as design freedom, versatile DPHM capabilities and minimum noise interference. Nevertheless, installation of the wired network can be an error-prone process requiring significant manpower and costs. It also adds extra weight to the aircraft. For some spots such as wings, the installation of wires often requires dismantling the aircraft's external structures. Alternatively, a wireless sensor system can effectively eliminate the wiring problems. For a wireless system, reliable and long-lasting power supply becomes critical. One emerging technology is to harvest energy from ambient sources (solar, vibration, thermal). Among them, mechanical energy is ubiquitously available in an aircraft operation environment, which is independent of weather and surrounding environment and can be harvested to power the wireless sensors.

PENG and TENG. Triboelectric and piezoelectric nanogenerators (TENG and PENG) are considered promising building blocks for the design and application of renewable, lightweight, and low-cost energy sources. Both triboelectric and piezoelectric nanostructures can convert mechanical energy into electricity. The basic working principle of TENG is a combination of contact electrification and electrostatic induction. The successive current output is obtained through the electric charge transfer that occurs in multiple in-plane charge separation cycles. TENG typically yields a high energy collection efficiency, nevertheless, it needs physical contact and separation motion of its multiple layers. In PENGs, piezoelectric polarization is generated at the end of each nanostructure upon the application of strain, pressure or external force. The polarization leads to electrical charge separation, yielding pulsed voltage/current output in press-and-release cycles.

Despite the advances to date in the art, there is an unmet need for real-time, in-situ DPHM with non-intrusive and minimum impacts to the aircrafts, easy installation and maintenance, and high accuracy. More particularly, there remains a need in the art for a sensing system that can be readily integrated into load-lifting structures (such as wings and landing gears) to provide real-time DPHM.

SUMMARY OF THE INVENTION

It is an object of the present invention to obviate or mitigate at least one of the above-mentioned disadvantages of the prior art.

It is another object of the present invention to provide a novel sensing system.

Accordingly, in one of its aspects, the present invention provides a sensing system comprising at least one shim portion secured with respect to at least one nanogenerator portion.

Thus, the present inventors have conceived a sensing system that can be readily integrated into load-lifting structures (such as wings and landing gears) to provide real-time DPHM and obviate/mitigate catastrophic problems. Broadly, the present sensing system combines at least one shim portion with at least one nanogenerator such as a TENG or a PENG.

PENGs demonstrate excellent sensitivity to external strain. Given the recent development in PENGs and TENGs, a novel hybrid device that can combine the merits from both TENGs and PENGs is particularly preferred for using in the present sensing system, which may not only enhance the energy conversion efficiency, but also achieve new functionalities such as self-powered strain sensors.

A major advantage of the present sensing system is that it combines in a single structure the following functions: (a) gap management in the component in which this system is installed, (b) collection/storage of measured data for the component in which the sensing system is installed, (c) harvesting/storing energy from operation environment of the component in which this system is installed (e.g., DPHM data when the present sensing system is used for assessment of an aircraft's structural conditions), and (d) wireless transmission of measured data for the component in which this system is installed to a user interface.

To the knowledge of the present inventors, a sensing system having such a combination of features is heretofore unknown.

While the detail description of the preferred embodiments of the present invention will be described with reference to use of the present sensing system in aerospace applications (including but not limited to obtaining and transmitting DPHM data in assessment of an aircraft's structural condition), it is to be clearly understood that the present sensing system can be applied in other applications where it is desirable to have a combination of gap management and collection/storage/transmission of measured data for a component in which the sensing system is involved.

The data measured by the present sensing system can be strain data, and that could be processed/interpreted in many ways, depending on the application of the present sensing system. In addition, or alternatively, the present sensing system could be installed in a component (e.g., an aircraft wing) and used to measure load (within or outside acceptable parameters), movement, wear, predictive wear and potential or real failure, etc. of that component.

In a preferred embodiment of the present sensing system, the measured data to be stored and transmitted would be the strain signal measured from the strain sensors. In one embodiment, the original data would be analog data (e.g., in units of milli-volt or volt). In such an embodiment, this analog data preferably would be converted to digital data via a control unit in the nanogenerator portion. Depending on measurement accuracy requirement, in Analog-to-Digital conversion, 8 or 12 digitization might be implemented. Preferably, the data transmission would be sent out on an intermittent or continuous basis wirelessly to a central data hub.

Potential applications of the present sensing system include (but are not limited to): strain sensing and DPHM in helicopters and UAVs, building movement and/or vibration measurement for buildings in, for example, earthquake or hurricane/typhoon/tornado prone areas, bridge movement measurement for load limit safety and maintenance timing determination, vibration monitoring in manufacturing equipment, strain sensing in aircraft (including jet fighters and UAVs) to be used as a feedback mechanism to automatically adjust engine thrust or direction to prevent or correct load limits being exceeded, strain sensing in automotive frames, and strain sensing in equipment designed for pulling or hauling.

BRIEF DESCRIPTION OF THE DRAWINGS

Embodiments of the present invention will be described with reference to the accompanying drawings, wherein like reference numerals denote like parts, and in which:

FIG. 1 illustrates a schematic comparison of conventional laminated shim, which can be used only for mechanically filling gaps (left) and a preferred embodiment of the present sensing system (right);

FIG. 2 illustrates alternate schematic layouts of preferred embodiments of the present sensing system: (a) parallel layout; (b) vertical layout; and (c) hybrid layout;

FIG. 3 illustrates a preferred embodiment (in schematic) of the vertical layout of present sensing system;

FIG. 4 illustrates top-view SEM images of ZnO homojunctions NWs on AZO with (a) 0% Li-doping; (b) 100% Li-doping; (c) 200% Li-doping; (d) 300% Li-doping;

FIG. 5 illustrates a schematic representation of a preferred embodiment of the nanogenerator fabrication process: (a) Shim substrate, (b) Deposition of an AZO seed layer by RF sputtering, (c) Photoresist spin-coating, (d) Windows opening by photolithography, (e) Selection growth of ZnO p-n homojunction NWs, (f) Stripping off residual photoresist by acetone, (g) Spin-coating a PMMA layer to cover the structure, (h) Deposition of a $MoO_3$ layer, (i) Deposition of a metal layer as the top electrode, and (j) Packing by PDMS;

FIG. 6 illustrates a schematic diagram of a fabricated nanogenerator (NG) made of the p-n homojunction ZnO nanowires;

FIG. 7 illustrates a schematic of a triboelectric nanogenerator useful in a preferred embodiment of the present sensing system;

FIG. 8 illustrates a schematic of a preferred power unit useful in a preferred embodiment of the present sensing system;

FIG. 9 illustrates a schematic of a preferred AC to DC converter circuit useful in the power unit illustrated in FIG. 8;

FIG. 10 illustrates preliminary experimental results of a ZnO nanowire based piezoelectric energy harvester fabricated on a flexible substrate;

FIG. 11 illustrates a demonstration of a proof-of-concept setup for wireless strain signal transmission;

FIG. 12 illustrates a schematic of a setup for the characterization of a fabricated ZnO nanowire-based piezoelectric energy harvester fabricated on a flexible substrate.

DETAILED DESCRIPTION OF THE PREFERRED EMBODIMENTS

The present invention relates to a sensing system comprising at least one shim portion secured with respect to at least one nanogenerator portion. Preferred embodiments of this sensing system may include any one or a combination of any two or more of any of the following features:
the nanogenerator portion comprises a piezoelectric nanogenerator;

the piezoelectric nanogenerator comprises an InN nanowire-based nanogenerator;
the piezoelectric nanogenerator comprises a ZnO nanowire-based nanogenerator;
the piezoelectric nanogenerator comprises a laminate structure having the following elements:
   (a) a substrate;
   (b) an electrically insulating buffer layer;
   (c) a first electrode element;
   (d) piezoelectric element is configured to convert mechanical and/or thermal energy to electrical energy; and
   (e) a second electrode element;
   wherein the nanogenerator further comprises an encapsulation element that encapsulates the laminate structure;
the substrate is a polymer;
the substrate is a non-polymeric material;
the substrate comprises a flexible material;
the substrate comprises a rigid material;
the substrate comprises polyethylene naphthalate (PEN);
the substrate comprises aluminum;
the substrate comprises a silicon wafer;
the substrate is coated with chromium;
the buffer layer is a polymer;
the buffer layer is a non-polymeric material;
the buffer layer comprises silicon nitride (SiN);
the buffer layer comprises silicon dioxide ($SiO_2$);
the buffer layer comprises aluminum oxide;
the first electrode comprises an optically-transparent first electrode;
the first electrode comprises a layer aluminum-doped zinc oxide (AZO)), for example 2 wt. % $Al_2O_3$+98 wt. % ZnO;
the first electrode comprises a layer indium tin oxide (ITO) layer;
the piezoelectric element comprises a n-p homojunction ZnO piezoelectric nanogenerator element;
the piezoelectric element comprises an InN nanowire-based piezoelectric nanogenerator element;
the solar cell element comprises a $n^+i-p^+$ nanocrystal/amorphous Si:H thin-film;
the piezoelectric element comprises multiple layers of polymers;
the piezoelectric element comprises multiple layers of non-polymeric materials;
the piezoelectric element comprises single or multiple layers of organic and/or inorganic materials;
the second electrode comprises an optically-transparent second electrode;
the cascade-type hybrid solar and piezoelectric (and/or triboelectric, and/or thermoelectric) nanogenerator defined in claims 1-19, wherein the second electrode comprises a layer aluminum-doped zinc oxide (AZO), for example 2 wt. % $Al_2O_3$+98 wt. % ZnO
the second electrode comprises a layer indium tin oxide (ITO) layer;
the first electrode and the second electrode are the same;
the first electrode and the second electrode are different;
the encapsulation element is a polymer.
the encapsulation element is a non-polymeric material;
the encapsulation element comprises polydimethylsiloxane (PDMS);
one or both of the buffer layer and the first electrode are deposited onto the substrate using a physical deposition method;
both of the buffer layer and the first electrode are deposited onto the substrate using a physical deposition method;
the physical deposition method radio-frequency (RF) magnetron sputtering at 150° C.;
the piezoelectric element is grown on the first electrode by a physical deposition method;
the piezoelectric element is grown on the first electrode by a chemical deposition method;
the piezoelectric element comprises a n-p homojunction ZnO piezoelectric nanogenerator element comprising ZnO homojunction nanowires that are grown using a hydrothermal method;
the hydrothermal method comprises as follows: providing an aqueous solution for growing n-type ZnO nanowires, the aqueous solution comprising a mixture of zinc (Zn) nitrate hexahydrate (25 mM), hexamethylenetetramine (25 mM) and aluminum (Al) nitrate nonahydrate, wherein the atomic ratio of Al to (Al+Zn) in the mixture solution is controlled at 3 wt. %; adding a doping agent (such as lithium (Li) nitrate (75 mM)) to the solution (heavily p-type); maintaining the aqueous solution at a substantially constant temperature of 88° C. during growth of the nanowires; and controlling the length of the ZnO nanowire by growth time (~500 nm/hour): one hour for the n-type section immediately followed by an additional half hour for the Li-doped p-type section;
the nanogenerator portion comprises a triboelectric nanogenerator;
the triboelectric nanogenerator is a PET-based nanogenerator;
the triboelectric nanogenerator is a PDMS-based nanogenerator;
the triboelectric nanogenerator is a PET/PDMS-based nanogenerator;
the at least one nanogenerator portion comprises:
   (a) a strain sensing portion;
   (b) an energy-harvesting portion; and
   (c) a data managing portion;
the energy-harvesting portion comprises an energy-storage portion configured to store harvested energy;
the energy-storage portion is configured to power the sensing system;
the data managing portion is configured to transmit measured data from the strain sensing portion to a remote location;
the data managing portion is configured to wirelessly transmit measured data from the strain sensing portion to a remote location;
the at least one shim portion comprises a metal;
the metal is selected from the group consisting of aluminum, steel, stainless steel, titanium, brass, copper, composites thereof and alloys thereof.
the at least one shim portion comprises an austenitic nickel-chromium-based alloys;
the at least one shim portion comprises a lithium-aluminum alloy;
the at least one shim portion comprises a plastic;
the at least one shim portion comprises a polymer;
the at least one shim portion comprises a carbon fibre material; and/or
the at least one shim portion comprises fibreglass.
Conventional shims are mechanical parts with the sole function of filling mechanical gaps for achieving critical dimensional tolerances. However, the present sensing systems (also referred to herein in some places as a "smart shim") will integrate multiple functions—gap management, strain sensing, energy harvesting, and data transmission—all in one piece with light weight and small physical footprint constraints—see FIG. 1.

FIG. 2 shows different layouts of preferred embodiments of the present sensing system.

In one option (parallel smart shim) as shown in FIG. 2(a), the functioning units—strain sensor (for sensing mechanical strain and deformation), energy harvester (for harvesting energy from surroundings and converting it to electrical energy), power unit (for converting AC electrical energy to DC electrical energy and storing it) and data unit (for collecting the strain signal and transmitting it to a remote base station)—are integrated laterally on the same shim layer.

FIG. 2(b) shows a second option (vertical smart shim), in which the different functioning units are fabricated on different shim layers and integrated vertically.

FIG. 2(c) shows a third option (hybrid smart shim), in which some functioning units are integrated on one shim layer, and other functioning units are integrated on another shim layer, and these two shim layers are then vertically integrated together to achieve a complete system. The parallel smart shim option needs to integrate different functioning units on one shim layer, which is demanding for device fabrication. On the other hand, the interconnection among different functioning units can be done on one shim layer.

The vertical smart shim option (FIG. 2(b)) can fabricate different functioning units on different shim layers, as a result, the device fabrication is simpler. However, the interconnection among different functioning units is more complex. The hybrid smart shim option (FIG. 3(c)) combines the advantages of the previous two options. In some applications, the hybrid smart shim option may be the preferred approach.

FIG. 3 illustrates a preferred embodiment of the layout of a preferred sensor system. In this preferred embodiment, the device consists of five layers: (i) the shim substrate (also serving as the bottom electrode, (ii) piezoelectric nanowires (for converting mechanical strain to electrical potential or electrical current), (iii) a poly-methyl methacrylate (PMMA) layer (for filling the gaps between nanowires, providing mechanical support to nanowires, and insulating the top electrode from the bottom electrode), (iv) a $MoO_3$ layer, and (v) an Au layer (as the top electrode). In other embodiments, the $MoO_3$ layer is omitted. The piezoelectric nanowires (NWs) are not particularly restricted. Preferably, the NWs are selected from the group consisting of InN NWs, GaN NWs, ZnO nanowires and the like. ZnO nanowires can be grown on the shim substrate by using either electrochemical or thermochemical deposition approaches.

The ZnO nanowires can be grown using electrochemical deposition in a three-electrode configuration, with a platinum mesh counter electrode and an Ag/AgCl reference electrode. In the illustrated embodiment, an aluminum-doped ZnO (AZO, 2 wt. % $Al_2O_3$+98 wt. % ZnO) layer was coated onto a pre-cleaned shim substrate using radio-frequency (RF) magnetron sputtering at 150° C. In some embodiments, the shim substrate is first coated with a layer of chromium and the AZO layer is then coated on top of the chromium layer. Other metals, such as gold or copper, alone or in combination with chromium, may also be used to coat the shim substrate. The AZO layer serves as both the conductive electrode and seed layer for NW growth in the subsequent electrochemical deposition. In the illustrated embodiment, photolithography was then employed to open an array of square windows, 200 µm apart, in a photoresist layer spun onto the AZO-coated PEN substrate. The retained photoresist mask ensures that NWs grow only on the exposed seed layer in the open windows.

The solution for growing intrinsic NWs (n-type) comprised 25 mM zinc nitrate ($Zn(NO_3)_2$), 12.5 mM hexamethylenetetramine (HMTA), 5 mM polyethyleneimine (PEI), and 0.3 M ammonium hydroxide. To obtain p-type NWs (Li-doped), different concentrations of a lithium nitrate doping reagent can be added. These concentrations (25 mM, 50 mM, and 75 mM) corresponded to different lithium mixture ratios (100%, 200%, and 300%, respectively) and produced differently Li-doped NWs. The working electrode's bias was fixed at −0.7 V with respect to the Ag/AgCl reference electrode. The NW length (~4 µm) was controlled by setting the growth time to three (3) hours for the intrinsic section (n-type) immediately followed by another three (3) hours for the Li-doped section (p-type). The solution temperature was maintained at 90° C. for 10 minutes followed by 88° C. for 170 minutes in both cases.

FIG. 4 illustrates scanning electron microscopy (SEM) images of the ZnO nanowires grown by using the electrochemical deposition. The single-crystalline NWs were roughly aligned along the vertical direction having tilting angles within ±25°. Their diameters ranged from 100 nm to 200 nm, with an area density of about $2.0 \times 10^9$ $cm^{-2}$.

FIG. 5 illustrates a preferred embodiment of a schematic of processing steps of fabricating a preferred embodiment of the present sensing system (in this case, a nanowire-based strain sensor). Square- or different-shape NW patterns with a side length of 1-10 cm can be employed in device fabrication. The NWs are first encapsulated with a spin-coated insulating layer of PMMA, which is then cured at 120° C. for three (3) hours. This layer provides a polymer matrix to protect NWs against damage during NG operation and prevents electrical shortage between the NGs' top and bottom electrodes. Due to its flexibility, PMMA does not impede the application of external strain to the NWs.

To increase the interfacial energy barrier and suppress leakage current, a thin molybdenum oxide ($MoO_3$) interlayer can be deposited on top of the PMMA layer by vacuum thermal evaporation using a shadow mask, followed by the deposition of a metallic cathode (aluminum or gold) to complete fabrication. The devices can be packaged in polydimethylsiloxane (PDMS), Dow Corning Sylgard™ 184 premixed with a curing agent at a ratio of 10:1 w/w and degassed, to prevent contamination, damage, and moisture penetration from the ambient environment.

FIG. 6 illustrates a schematic layout of a preferred embodiment of the present sensing system based on ZnO homojunction NWs. By using ZnO homojunction NWs, the efficiency of converting mechanical energy to electrical energy can be significantly enhanced. The fabrication of such an energy harvest device is similar to that of a ZnO nanowire-based strain sensor. A difference between these two devices is that the strain sensor should be sensitive to mechanical strain and have a low noise level, while the energy harvester should have a high efficiency in converting mechanical energy to electrical energy. The ZnO nanowires and the device configurations can be optimized differently for these two devices in terms of their different technical requirements.

Further details on a preferred piezoelectric nanogenerator that may be used in a preferred embodiment of the present sensing system may be found in co-pending Canadian patent application 2,967,004 and U.S. provisional patent application Ser. No. 62/602,895, both filed on May 11, 2017. See, also, G. Liu, E. Abdel-Rahman, D. Ban, Performance optimization of p-n homojunction nanowire-based piezoelectric nanogenerators through control of doping concentration. *J. Appl. Phys.,* 2915, 118, 094307.

When the piezoelectric nanogenerator is InN nanowire-based, see also, G. Liu, S. Zhao, R. D. Henderson, Z. Leonenko, E. Abdel-Rahman, Z. Mi, and D. Ban, "Nanogenerators based on vertically aligned InN nanowires," *Nanoscale,* 2016, 8, 2097-2106.

The energy harvester unit can be also fabricated using triboelectric devices. The energy conversion efficiency of a triboelectric device typically depends on relative mechanical displacement of the two electrodes of the device. Where the mechanical relative displacement is sizeable, a triboelectric energy harvester can be more beneficial than a piezoelectric energy harvester.

A triboelectric device has a simpler layer structure than a piezoelectric device. It typically consists of two metallic electrode layers separated by a polymer insulating layer. FIG. 7 illustrates a preferred embodiment of a triboelectric device in the present sensing system, the triboelectric device comprising an upper PMMA layer, an upper electrode, a Polydimethylsiloxane (PDMS) layer, a lower electrode, and a lower PMMA layer. The metallic electrode layer can be deposited on the PMMA substrate by thermal evaporation. The PDMS layer can be deposited on the metallic electrode layer by spin-coating. Metallic nanoparticles (such as Au nanoparticles) can be inserted into the interface between the PDMS layer and the lower electrode layer to enhance the energy conversion efficiency.

In a preferred embodiment, the triboelectric nanogenerator for use in the present sensing system is produced using the following non-limiting process:

1. A mold layer is patterned using photolithography on a silicon wafer (5 inches in diameter, for example).
2. The patterned wafers are etched anisotropically using a dry etching process, resulting in the formation of recessed pyramids.
3. After cleaning with acetone and isopropanol, all of the Si wafers are treated with trimethylchlorosilane (Sigma Aldrich) by gas phase silanization to avoid the adhesion between PDMS and Si molds.
4. In preparing the patterned polymer films, PDMS elastomer and cross-linker (Sylgard 184, Tow Corning) are mixed and then casted on the Si wafer.
5. After a degassed process under vacuum, the elastomer mixture is spin-coated at 500 rpm for 60 s.
6. After incubated at 85° C. for 1 h, a uniform PDMS thin film is peeled off from Si mold and place on uncured PDMS on a piece of clean ITO-coated PET film.
7. Another clean ITO-coated PET film is placed onto the prepared PDMS-PET substrate to form a sandwiched structure.
8. The two short edges of the device are then sealed with ordinary adhesive tape to ensure an adequate contact between PET and patterned PDMS films.

As many shim substrates are made of metallic materials, they can be used as the upper and lower electrode layers, which can simplify the device fabrication and integration of the energy harvester component in the present sensing system.

The generated energy is preferably stored in a battery or capacitor so that it can be used to power devices in a regulated manner. Between the power generation unit and a storage unit, it is preferred to implement a power management circuit to maximize power storage efficiency. The central goal is to develop more-efficient energy harvesting and management circuitry for transferring harvested energy to the battery layers for storage, as well as for managing the energy consumed by the data unit.

FIG. 8 illustrates a preferred embodiment of the basic layout of an example power unit, which typically includes an electronic circuit for converting AC electrical current to DC electrical current and an energy storage unit. The AC electrical power from the energy harvester is converted to DC electrical power via the AC to DC converter and is stored in the energy storage unit. The stored electrical power will be used to bias the other components (such as the data unit) for strain data collection and transmission.

A representative AC to DC converter circuit is shown in FIG. 9, which consists of four pn junction diodes and one capacitor. The pn junctions and the capacitor can be fabricated by using ASIC (amorphous silicon integration circuit) technologies. The energy storage unit can be a super-capacitor or thin-film based lithium rechargeable batteries. For metallic shim substrates, two neighboring shim layers separated by an electrical insulating layer with a high dielectric constant can be used as the two electrodes of the super-capacitor.

The data unit is for strain signal collection and transmission. The data unit can be a standalone unit, which is commercially-available, such as a RF24L01 wireless connector from Soc-Robotics.com. It can transmit the collected strain signal to a base station that is within a short distance. Another option is to directly fabricate a data collection and transmission circuit on a shim substrate using ASIC technologies. As the wireless transmission distance is short and the data transmission rate is low, such an ASIC circuit should be sufficient to meet the technical requirements of the data unit.

FIG. 10 illustrates preliminary experimental results of a ZnO nanowire-based piezoelectric energy harvester fabricated on a flexible substrate. The average peak open-circuit voltage is 0.7 V and the average peak short-circuit current is 42 nA, yielding a 0.03 µW peak output power.

FIG. 11 illustrates a proof-of-concept setup for wireless strain signal transmission. The strain sensors were two commercial strain gauges (Vishay Precision Group), which were under mechanical vibration. The strain data was collected by a wireless sensor node powered by an energy harvesting system and transmitted to a nearby base station. The preliminary experimental results show that the applied strain on the strain sensors was 1600µε at a frequency of 3 Hz.

FIG. 12 illustrates a schematic of a setup for the characterization of a fabricated ZnO nanowire-based piezoelectric energy harvester fabricated on a flexible substrate. The system includes a closed loop controller (VR9500 Revolution) and a linear shaker (Labworks Inc., ET-126-1). The shaker can provide mechanical strain with a particular frequency, acceleration, and amount of force. Using the illustrated set-up, the resulting output open circuit voltage and output short circuit current of the piezoelectric energy harvester was measured using Stanford low-noise voltage/current preamplifiers (Model SR560/570), with the input resistance of the preamplifiers set to 100 MΩ (SR560) and 10 kΩ (SR570), respectively (see FIG. 10).

While this invention has been described with reference to illustrative embodiments and examples, the description is not intended to be construed in a limiting sense. Thus, various modifications of the illustrative embodiments, as well as other embodiments of the invention, will be apparent to persons skilled in the art upon reference to this description. It is therefore contemplated that the appended claims will cover any such modifications or embodiments.

All publications, patents and patent applications referred to herein are incorporated by reference in their entirety to the same extent as if each individual publication, patent or patent application was specifically and individually indicated to be incorporated by reference in its entirety.

LIST OF BACKGROUND REFERENCES

[1] G. Liu, "Semiconductor Nanowire Based Piezoelectric Energy Harvesters: Modeling, Fabrication, and Characterization," Ph.D. thesis, 2015, University of Waterloo.
[2] M. Q. Le, J.-F. Capsal, M. Lallart, Y. Hebrard, A. Van Der Ham, N. Reffe, L. Geynet, and P.-J. Cottinet, "Review on energy harvesting for structural health monitoring in aeronautical applications," *Prog. Aerosp. Sci.*, 2015, 79, 147-157.
[3] Y. Hu and Z. L. Wang, "Recent progress in piezoelectric nanogenerators as a sustainable power source in self-powered systems and active sensors," *Nano Energy*, 2015, 14, 3-14.
[4] R. Hinchet, W. Seung, and S. W. Kim, "Recent Progress on Flexible Triboelectric Nanogenerators for SelfPowered Electronics," *ChemSusChem*, 2015, 8, 2327-2344.
[5] F. R. Fan, W. Tang, and Z. L. Wang, "Flexible Nanogenerators for Energy Harvesting and Self-Powered Electronics," *Adv. Mater.*, 2016.
[6] Z. L. Wang, J. Chen, and L. Lin, "Progress in triboelectric nanogenerators as a new energy technology and self-powered sensors," *Energy Environ. Sci.*, 2015, 8, 2250-2282.
[7] J. Briscoe and S. Dunn, "Piezoelectric nanogenerators—a review of nanostructured piezoelectric energy harvesters," *Nano Energy*, 2015, 14, 15-29.
[8] S. Wang, L. Lin, and Z. L. Wang, "Triboelectric nanogenerators as self-powered active sensors," *Nano Energy*, 2015, 11, 436-462.
[9] M. Han, X.-S. Zhang, B. Meng, W. Liu, W. Tang, X. Sun, W. Wang, and H. Zhang, "r-Shaped hybrid nanogenerator with enhanced piezoelectricity," *ACS Nano*, 2013, 7, 8554-8560.
[10] X. Li, Z.-H. Lin, G. Cheng, X. Wen, Y. Liu, S. Niu, and Z. L. Wang, "3D Fiber-Based Hybrid Nanogenerator for Energy Harvesting and as a Self-Powered Pressure Sensor," *ACS Nano*, 2014, 8, 10674-10681.
[11] K. Y. Lee, M. K. Gupta, and S.-W. Kim, "Transparent flexible stretchable piezoelectric and triboelectric nanogenerators for powering portable electronics," *Nano Energy*, 2015, 14, 139-160.
[12] S.-B. Jeon, D. Kim, G.-W. Yoon, J.-B. Yoon, and Y.-K. Choi, "Self-cleaning hybrid energy harvester to generate power from raindrop and sunlight," *Nano Energy*, 2015, 12, 636-645.
[13] X. Wang, S. Wang, Y. Yang, and Z. L. Wang, "Hybridized Electromagnetic-Triboelectric Nanogenerator for Scavenging Air-Flow Energy to Sustainably Power Temperature Sensors," *ACSNano*, 2015, 9, 4553-4562.
[14] T. Quan, X. Wang, Z. L. Wang, and Y. Yang, "Hybridized Electromagnetic-Triboelectric Nanogenerator for a Self-Powered Electronic Watch," *ACSNano*, 2015, 9, 12301-12310.
[15] Y. Zi, L. Lin, J. Wang, S. Wang, J. Chen, X. Fan, P. K. Yang, F. Yi, and Z. L. Wang, "Triboelectric-Pyroelectric-Piezoelectric Hybrid Cell for High-Efficiency Energy-Harvesting and Self-Powered Sensing," *Adv. Mater.*, 2015, 27, 2340-2347.
[16] Y. Yang and Z. L. Wang, "Hybrid energy cells for simultaneously harvesting multi-types of energies," *Nano Energy*, 2015, 14, 245-256.
[17] S. Wang, Z. L. Wang, and Y. Yang, "A One-Structure-Based Hybridized Nanogenerator for Scavenging Mechanical and Thermal Energies by Triboelectric-Piezoelectric-Pyroelectric Effects," *Advanced materials* (Deerfield Beach, Fla.), 2016.
[18] W.-S. Jung, M.-G. Kang, H. G. Moon, S.-H. Baek, S.-J. Yoon, Z.-L. Wang, S.-W. Kim, and C.-Y. Kang, "High output piezo/triboelectric hybrid generator," *Sci. Rep.*, 2015, 5.
[19] S. Niu, Y. Liu, S. Wang, L. Lin, Y. S. Zhou, Y. Hu, and Z. L. Wang, "Theoretical Investigation and Structural Optimization of Single-Electrode Triboelectric Nanogenerators," *Adv. Funct. Mater.*, 2014, 24, 3332-3340.
[20] H. Jang, Y. J. Park, X. Chen, T. Das, M. S. Kim, and J. H. Ahn, "Graphene-Based Flexible and Stretchable Electronics," *Adv. Mater.*, 2016.
[21] C. Hu, L. Song, Z. Zhang, N. Chen, Z. Feng, and L. Qu, "Tailored graphene systems for unconventional applications in energy conversion and storage devices," *Energy Environ. Sci.*, 2015, 8, 31-54.
[22] B. N. Chandrashekar, B. Deng, A. S. Smitha, Y. Chen, C. Tan, H. Zhang, H. Peng, and Z. Liu, "Roll-to-Roll Green Transfer of CVD Graphene onto Plastic for a Transparent and Flexible Triboelectric Nanogenerator," *Adv. Mater.*, 2015, 27, 5210-5216.
[23] S. Kim, M. K. Gupta, K. Y. Lee, A. Sohn, T. Y. Kim, K. S. Shin, D. Kim, S. K. Kim, K. H. Lee, and H. J. Shin, "Transparent flexible graphene triboelectric nanogenerators," *Adv. Mater.*, 2014, 26, 3918-3925.
[24] L. E. Greene, M. Law, J. Goldberger, F. Kim, J. C. Johnson, Y. Zhang, R. J. Saykally, and P. Yang, "Low-temperature wafer-scale production of ZnO nanowire arrays," *Angew. Chem. Int. Ed.*, 2003, 42, 3031-3034.
[25] D.-M. Shin, E. L. Tsege, S. H. Kang, W. Seung, S.-W. Kim, H. K. Kim, S. W. Hong, and Y.-H. Hwang, "Freestanding ZnO nanorod/graphene/ZnO nanorod epitaxial double heterostructure for improved piezoelectric nanogenerators," *Nano Energy*, 2015, 12, 268-277.
[26] G. Liu, S. Zhao, R. D. Henderson, Z. Leonenko, E. Abdel-Rahman, Z. Mi, and D. Ban, "Nanogenerators based on vertically aligned InN nanowires," *Nanoscale*, 2016, 8, 2097-2106.
[27] G. Liu, E. Abdel-Rahman, D. Ban, Performance optimization of p-n homojunction nanowire-based piezoelectric nanogenerators through control of doping concentration. *J. Appl. Phys.*, 2915, 118, 094307.
[28] R. S. Dhar, L. Li, H. Ye, S, G. Razavipour, X. Wang, R. Q. Yang, D. Ban, "Nanoscopically resolved dynamic charge carrier distribution in operating interband cascade lasers," *Laser & Photonics Review*, 2015, 8, 224.
[29] R. S. Dhar, S. G. Razavipour, E. Dupont, C. Xu, S. Laframboise, Z. Wasilewski, Q. Hu, D. Ban, "Direct Nanoscale Imaging of Evolving Electric Field Domains in Quantum Structures," *Scientific Reports*, 2014, 4, 7183.
[30] S. Fathololoumi, E. Dupont, C. W. I. Chan, etc., "Terahertz quantum cascade lasers operating up to ~200K with optimized oscillator strength and improved injection tunneling," *Optics Express*, 2012, 20, 3866.
[31] Jun Chen, Dayan Ban, Michael G. Helander, Zhenghong Lu and P. Poole, "Near-infrared inorganic/organic optical upconverter with an external efficiency of >100%", *Advanced Materials*, 2010, 22, 4900.

[32] Jun Chen, Jianchen Tao, Dayan Ban, M. G. Helander, Z. Wang, J. Qiu, Z. H. Lu, "Organic/Inorganic Hybrid Pixelless Imaging Device," *Advanced Materials*, 2012, 24, 3138.

[33] Cheng-Ying Chen, Jun-Han Huang, Jinhui Song, Yusheng Zhou, Long Lin, Po-Chien Huang, Yan Zhang, Chuan-Pu Liu, Jr-Hau He, and Zhong Lin Wang, "Anisotropic Outputs of a Nanogenerator from Oblique-Aligned ZnO Nanowire Arrays" ACS Nano, 2011, 5, 6707-6713.

[34] Nai-Jen Ku, Jun-Han Huang, Chao-Hung Wang, Hsin-Chiao Fang, and Chuan-Pu Liu, "Crystal Face-Dependent Nanopiezotronics of an Obliquely Aligned InN Nanorod Array" Nano Letters, 2012, 12, 562-568.

[35] Ruey-Chi Wang, Hsin-Ying Lin, Chao-Hung Wang, and Chuan-Pu Liu, "Fabrication of a large-area Al-doped ZnO nanowire array photosensor with enhanced photoresponse by straining" Advanced Functional Materials, 2012, 22, 3875-3881.

[36] Nai-Jen Ku, Chao-Hung Wang, Jun-Han Huang, Hsin-Chiao Fang, Po-Chien Huang and Chuan-Pu Liu, "Energy Harvesting from the Obliquely Aligned InN Nanowire Array with a Surface Electron-Accumulation Layer" Advanced Materials, 2013, 25, 861-866.

[37] Chia-Hao Tu, Waileong Chen, Hsin-Chiao Fang, Yonhua Tzeng, Chuan-Pu Liu, "Heteroepitaxial nucleation and growth of graphene nanowalls on silicon" Carbon, 2013, 54, 234-240.

[38] Chao-Hung Wang, Wei-Shun Liao, Zong-Hong Lin, Nai-Jen Ku, Yi-Chang Li, Yen-Chih Chen, Zhong-Lin Wang and Chuan-Pu Liu, *"Optimization of the Output Efficiency of GaN Nanowire Piezoelectric Nanogenerators by Tuning the Free Carrier Concentration"* Advanced Energy Materials, 2014, 4, 1400392.

[39] Chao-Hung Wang, Wei-Shun Liao, Nai-Jen Ku, Yi-Chang Li, Yen-Chih Chen, Li-Wei Tu and Chuan-Pu Liu, *"Effects of Free Carriers on Piezoelectric Nanogenerators and Piezotronic Devices Made of GaN Nanowire Arrays"* Small, 2014, 10, 4718-4725.

[40] Yen-Yu Chen, Chao-Hung Wang, Giin-Shan Chen, Yi-Chang Li and Chuan-Pu Liu, "Self-powered n-MgxZn1-xO/p-Si photodetector improved by alloying-enhanced piezopotential through piezo-phototronic effect" Nano Energy, 2015, 11, 533-539.

[41] Chao-Hung Wang, Kun-Yu Lai, Yi-Chang Li, Yen-Chih Chen, and Chuan-Pu Liu, "Ultrasensitive Thin-Film-Based $Al_xGa_{1-x}N$ Piezotronic Strain Sensors via Alloying-Enhanced Piezoelectric Potential" Advanced Materials, 2015, 27, 6289-6295.

[42] Dayan Ban, Guocheng Liu, Cascade-type hybrid energy cells for driving wireless sensors, copending Canadian patent application 2,967,004 and U.S. provisional patent application Ser. No. 62/602,895, both filed on May 11, 2017.

What is claimed is:

1. A sensing system for gap management in an component in which this system is to be installed, the sensing system comprising at least one shim portion secured with respect to at least one nanogenerator portion; wherein the at least one nanogenerator portion comprises:
   (i) a strain sensing portion configured to sense strain in the component;
   (ii) an energy-harvesting portion configured to harvest energy from the component with a piezoelectric nanogenerator and to power the sensing system; and
   (iii) a data managing portion configured to receive sensed strain data from the strain sensing portion and wirelessly communicate said data to a receiver,
   wherein the shim portion is shaped to position in a gap in the component and mechanically fill the gap.

2. The sensing system defined in claim 1, wherein the strain sensing portion, the energy-harvesting portion, and the data managing portion are integrated laterally on a same layer of the nanogenerator portion; or
   wherein the strain sensing portion, the energy-harvesting portion, and the data managing portion are each on different layers of the nanogenerator portion; or
   wherein at least two of the strain sensing portion, the energy-harvesting portion, and the data managing portion are each integrated on a same layer of the nanogenerator portion.

3. The sensing system defined in claim 1, wherein the piezoelectric nanogenerator comprises a laminate structure having the following elements:
   (a) a substrate;
   (b) an electrically insulating buffer layer;
   (c) a first electrode element;
   (d) piezoelectric element is configured to convert mechanical and/or thermal energy to electrical energy; and
   (e) a second electrode element;
   wherein the nanogenerator further comprises an encapsulation element that encapsulates the laminate structure.

4. The sensing system defined in claim 3, wherein the substrate is coated with chromium.

5. The sensing system defined in claim 3, wherein the first electrode comprises an optically-transparent first electrode.

6. The sensing system defined in claim 3, wherein the first electrode comprises a layer aluminum-doped zinc oxide (AZO), for example 2 wt. % Al2O3+98 wt. % ZnO.

7. The sensing system defined in claim 6, wherein the layer of aluminum-doped zinc oxide comprises 2 wt % $Al_2O_3$ and 98 wt % ZnO.

8. The sensing system defined in claim 3, wherein the first electrode comprises a layer indium tin oxide (ITO) layer.

9. The sensing system defined in claim 3, wherein the piezoelectric element comprises a n-p homojunction ZnO piezoelectric nanogenerator element.

10. The sensing system defined in claim 3, wherein the piezoelectric element comprises an InN nanowire-based piezoelectric nanogenerator element.

11. The sensing system defined in claim 3, wherein the second electrode comprises an optically-transparent second electrode.

12. The sensing system defined in claim 1, wherein the nanogenerator portion comprises a triboelectric nanogenerator.

13. The sensing system defined in claim 1, wherein the at least one nanogenerator portion comprises an energy-storage portion configured to store harvested energy.

14. The sensing system defined claim 13, wherein the energy-storage portion is configured to power the sensing system.

15. The sensing system defined in claim 1, wherein the data managing portion is configured to transmit measured data from the strain sensing portion to a receiver, wherein the receiver is a base station of an aircraft.

16. The sensing system defined in claim 1, wherein the data managing portion is configured to wirelessly transmit measured data from the strain sensing portion to a receiver, wherein the receiver is a base station of an aircraft.

17. The sensing system of claim 1, wherein the piezoelectric nanogenerator comprises:
   a first electrode;
   piezoelectric nanowires;

a mechanical support layer to support the piezoelectric nanowires; and a second electrode.

18. The sensing system of claim 17, wherein the mechanical support layer comprises poly-methyl methacrylate (PMMA).

19. The sensing system of claim 17, comprising a $MoO_3$ layer.

20. The sensing system of claim 17, wherein the nanowires are at least one of InN nanowires, GaN nanowires, ZnO nanowires.

21. A sensing system for gap management in a component in which this system is to be installed, the sensing system comprising at least one shim portion formed as a washer secured with respect to at least one nanogenerator portion, the at least one nanogenerator portion comprising:
   (i) a strain sensing portion configured to sense strain in the component;
   (ii) an energy-harvesting portion configured to configured to harvest energy from the component with a piezoelectric nanogenerator and to power the sensing system; and
   (iii) a data managing portion configured to receive sensed strain data from the strain sensing portion and to communicate said data to a receiver.

22. A sensing system comprising at least one shim portion secured with respect to at least one piezoelectric nanogenerator portion; wherein the at least one piezoelectric nanogenerator comprises a laminate structure having the following elements:
   (a) a substrate coated with chromium;
   (b) an electrically insulating buffer layer;
   (c) a first electrode element;
   (d) piezoelectric element is configured to convert mechanical and/or thermal energy to electrical energy; and
   (e) a second electrode element;
   wherein the nanogenerator further comprises an encapsulation element that encapsulates the laminate structure.

* * * * *